(12) United States Patent
Chan et al.

(10) Patent No.: US 12,230,603 B2
(45) Date of Patent: Feb. 18, 2025

(54) METHOD OF FABRICATING A SEMICONDUCTOR CHIP HAVING STRENGTH ADJUSTMENT PATTERN IN BONDING LAYER

(71) Applicant: Taiwan Semiconductor Manufacturing Company, Ltd., Hsinchu (TW)

(72) Inventors: Hong-Wei Chan, Hsinchu (TW); Jiing-Feng Yang, Hsinchu County (TW); Yung-Shih Cheng, Hsinchu (TW); Yao-Te Huang, Hsinchu (TW); Hui Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/359,825

(22) Filed: Jul. 26, 2023

(65) Prior Publication Data

US 2023/0369285 A1 Nov. 16, 2023

Related U.S. Application Data

(63) Continuation of application No. 17/213,162, filed on Mar. 25, 2021, now Pat. No. 11,756,924.

(51) Int. Cl.
*H01L 21/78* (2006.01)
*H01L 21/768* (2006.01)
*H01L 23/00* (2006.01)

(52) U.S. Cl.
CPC ............ *H01L 24/94* (2013.01); *H01L 21/768* (2013.01); *H01L 21/7806* (2013.01)

(58) Field of Classification Search
CPC ... H01L 24/94; H01L 21/768; H01L 21/7806; H01L 24/92; H01L 24/27; H01L 24/29; H01L 24/13; H01L 24/32; H01L 2224/13111; H01L 2224/2745; H01L 2224/27452; H01L 24/83;
(Continued)

(56) References Cited

U.S. PATENT DOCUMENTS

5,071,792 A * 12/1991 VanVonno ........ H01L 21/30604
438/464
6,237,218 B1 * 5/2001 Ogawa ................ H05K 3/4638
428/209
(Continued)

*Primary Examiner* — Duy T Nguyen
(74) *Attorney, Agent, or Firm* — JCIPRNET (57) ABSTRACT

A method of fabricating a semiconductor chip includes the following steps. A bonding material layer is formed on a first wafer substrate and is patterned to form a first bonding layer having a strength adjustment pattern. A semiconductor component layer and a first interconnect structure layer are formed on a second wafer substrate. The first interconnect structure layer is located. A second bonding layer is formed on the first interconnect structure layer. The second wafer substrate is bonded to the first wafer substrate by contacting the second bonding layer with the first bonding layer. A bonding interface of the second bonding layer and the first bonding layer is smaller than an area of the second bonding layer. A second interconnect structure layer is formed on the semiconductor component layer. A conductor terminal is formed on the second interconnect structure layer.

20 Claims, 10 Drawing Sheets

(58) Field of Classification Search
CPC ... H01L 2223/5442; H01L 2223/54426; H01L 2223/54453; H01L 2224/2761; H01L 2224/2762; H01L 2224/29011; H01L 2224/29187; H01L 2224/29188; H01L 2224/32225; H01L 2224/73253; H01L 2224/83009; H01L 2224/83122; H01L 2224/8313; H01L 2224/83132; H01L 2224/83193; H01L 2224/83203; H01L 2224/83896; H01L 2224/92242; H01L 2224/94; H01L 21/78; H01L 23/544
USPC .......................................................... 438/458
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2010/0134583 A1* | 6/2010 | Koroishi ................ B41J 2/3359 156/196 |
| 2010/0155932 A1* | 6/2010 | Gambino ............ H01L 27/0688 257/713 |
| 2013/0320463 A1* | 12/2013 | Chang ..................... H01L 24/97 438/51 |

* cited by examiner

METHOD OF FABRICATING A SEMICONDUCTOR CHIP HAVING STRENGTH ADJUSTMENT PATTERN IN BONDING LAYER

CROSS-REFERENCE TO RELATED APPLICATION

This application is a continuation of and claims the benefit of a prior U.S. application Ser. No. 17/213,162, filed Mar. 25, 2021, now granted as U.S. Pat. No. 11,756,924. The entirety of each of the above-mentioned patent applications is hereby incorporated by reference herein and made a part of this specification.

BACKGROUND

The semiconductor industry has experienced rapid growth due to continuous improvement in integration density of various components, e.g., transistors, diodes, resistors, capacitors, etc. For the most part, this improvement in integration density has come from successive reductions in minimum feature size, which allows more components to be integrated into a given area. However, process limitations have made it difficult to continue shrinking the minimum feature size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1:
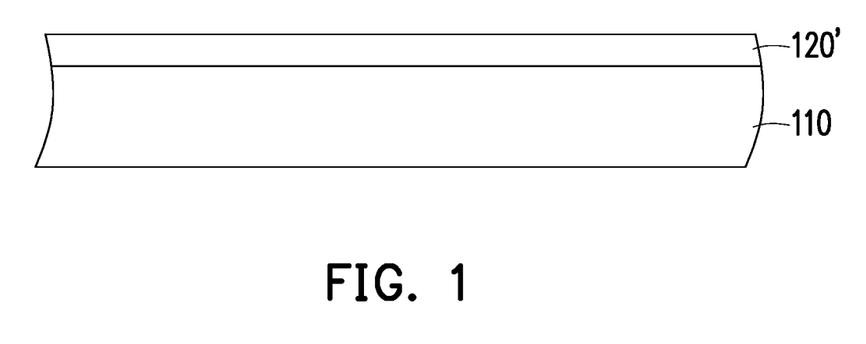
FIGS. 1 to 8 are schematic cross-sectional views showing various stages in a method of fabricating a semiconductor chip according to some embodiments.

Referring to FIG. 1, a first wafer substrate 110 with a bonding material layer 120' thereon is provided. The first wafer substrate 110 includes glass, ceramic, silicon, combinations thereof, multi-layers thereof, or other suitable material that can provide structural support for subsequent formed components and endure the fabrication conditions in subsequent processing. The first wafer substrate 110 is a raw substrate without a circuitry component thereon or therein.

The bonding material layer 120' is formed on the first wafer substrate 110 through a deposition process. The deposition process includes a chemical vapor deposition (CVD), a physical vapor process (PVD, or the like). In some embodiments, the CVD includes a low-pressure chemical vapor deposition (LPCVD), a plasma-enhanced CVD (PECVD), a high-density plasma deposition, a combination thereof or the like. A material of the bonding material layer 120' includes an inorganic material. The material of the bonding material layer 120' is compatible to the subsequent processes. For example, the material of the bonding material layer 120' can endure the fabrication temperature, the fabrication pressure, etc. of the subsequent processes without being deteriorated and without contaminating the processing machines in the subsequent processes. In addition, the material of the bonding material layer 120' can provide desirable adhesion for bonding to another component permanently. In some embodiments, the material of the bonding material layer 120' can be a dielectric material selected from at least one of silicon oxide, silicon oxynitride, silicon nitride, undoped silicate glass (USG), borosilicate glass (BSG), phosphoric silicate glass (PSG), borophosphosilicate glass (BPSG), fluorinated silicate glass (FSG), tetraethoxysilane (TEOS) silicate oxide, or a combination thereof. The TEOS silicate oxide can be optionally formed by high-density plasma (HDP) process. In some alternative embodiments, the material of the bonding material layer 120' can be metal, metal alloy, or the like.

Figure 2:
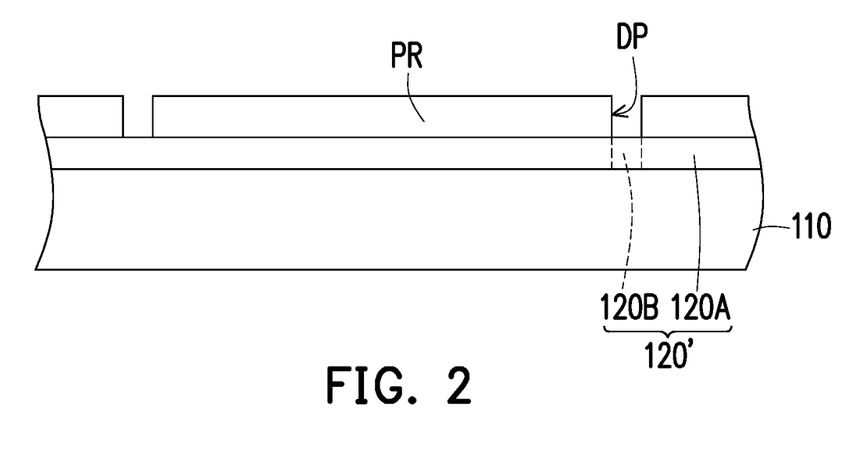

In FIG. 2, a patterned photoresist layer PR is formed on the bonding material layer 120'. The photoresist layer PR is formed by coating a photoresist material on the bonding material layer 120' followed by a photolithography process so that the patterned photoresist layer PR having a pattern defining opening DP is formed. The patterned photoresist layer PR covers a first portion 120A of the bonding material layer 120' while reveals a second portion 120B of the bonding material layer 120' at the pattern defining opening DP.

Figure 3:
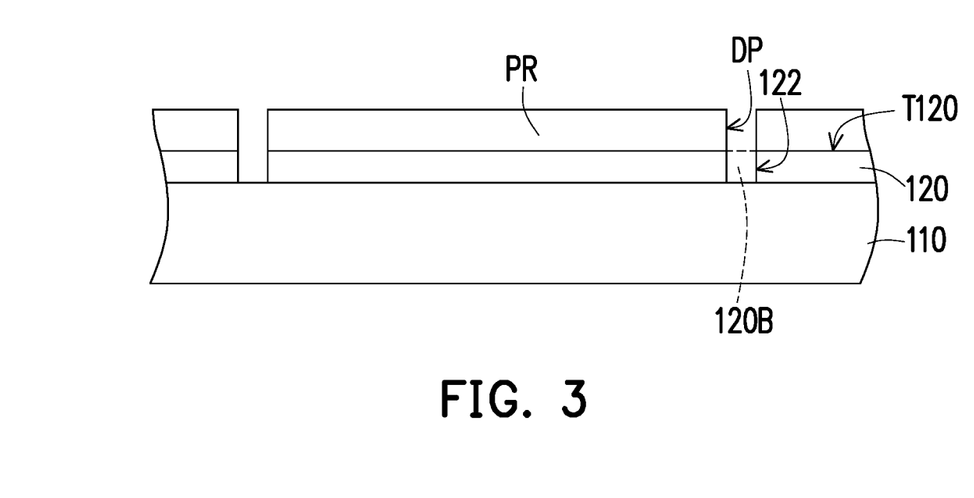

In FIG. 3, an etching process is performed on the bonding material layer 120' by using the patterned photoresist layer PR as a mask to form a first bonding layer 120 on the first wafer substrate 110. In the etching process, the second portion 120B of the bonding material layer 120' that is not shielded by the patterned photoresist layer PR is removed to form a strength adjustment pattern 122 in the first bonding layer 120. The position and the size of the pattern defining opening DP as well as the strength adjustment pattern 122 are determined based on the predetermined formed semiconductor chip. The second portion 120B is completely removed to expose the first wafer substrate 110, but the disclosure is not limited thereto. In some embodiments, the etching process is controlled to partially remove the second portion 120B so that the second portion 120B is thinned without revealing the first wafer substrate 110. In the embodiment, the first bonding layer 120 is patterned on the first wafer substrate 110 through a photolithography and etching process, but is not limited thereto. In some embodiments, the bonding material layer 120' is patterned by a laser irradiation process to form the first bonding layer 120 having the strength adjustment pattern 122. In some alternative embodiments, the strength adjustment pattern 122 may be formed by performing other patterning process. In some embodiments, the patterning process may further remove a portion of the first wafer substrate 110 at the pattern defining opening DP so that a portion of the strength adjustment pattern 122 extends into the first wafer substrate 110 in the thickness direction.

Figure 4:
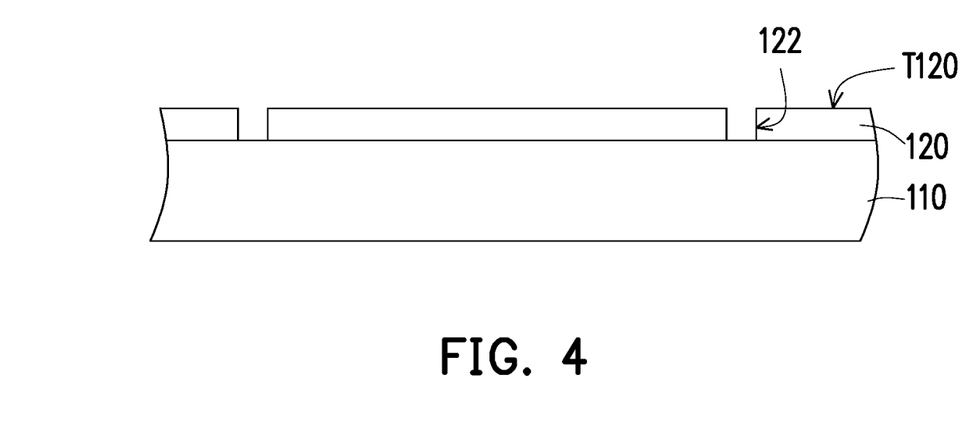

As shown in FIG. 4, the patterned photoresist layer PR is removed from the first bonding layer 120. The strength adjustment pattern 122 of the first bonding layer 120 is a concave structure that is concaved towards the first wafer substrate 110 from the surface T120 of the first bonding layer 120. In some embodiments, the strength adjustment pattern 122 extends through the overall thickness of the first bonding layer 120. In some embodiments, the strength adjustment pattern 122 extends through a portion of the thickness of the first bonding layer 120 so that the first bonding layer 120 has a thinner thickness at the strength adjustment pattern 122.

Figure 5:
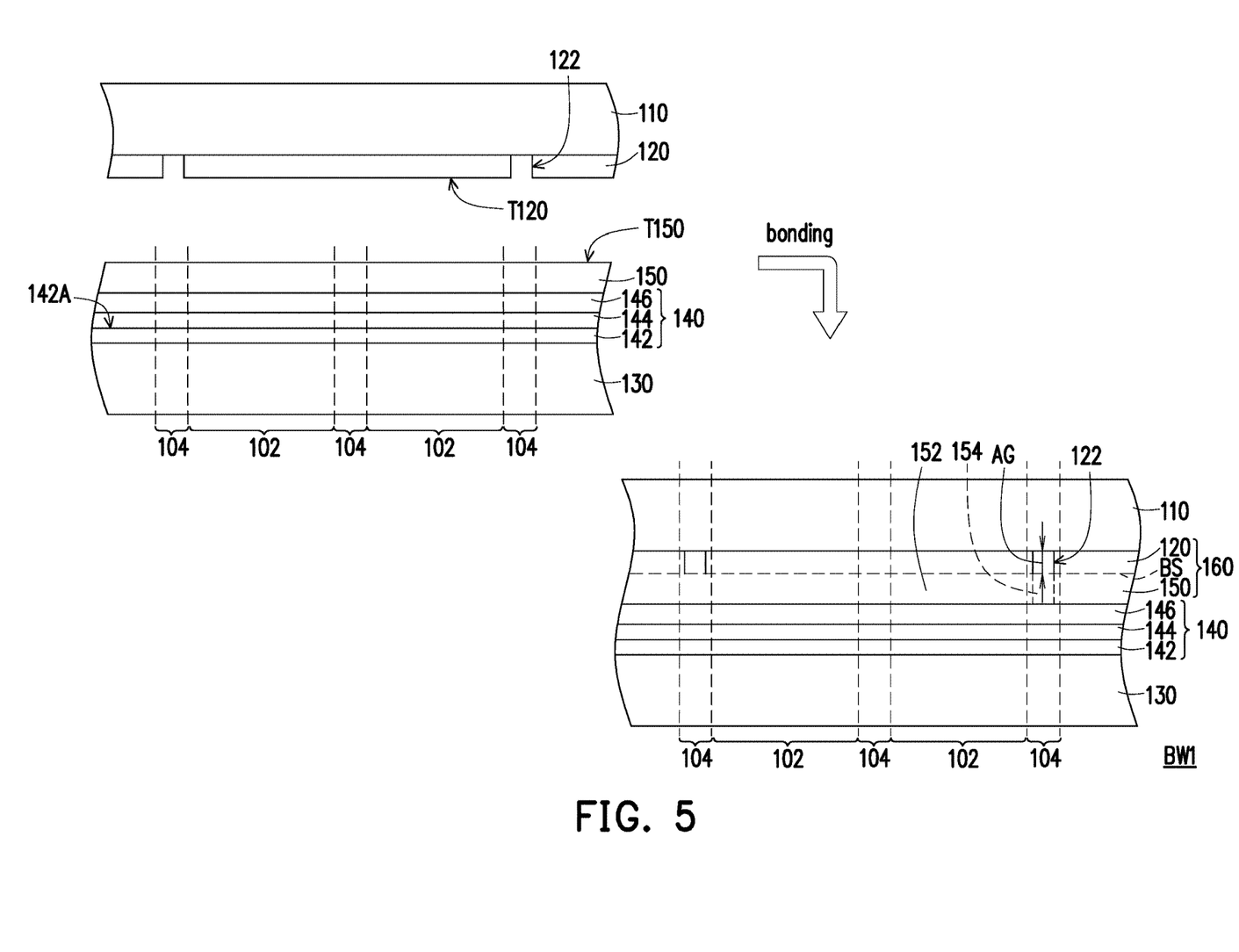

In FIG. 5, a second wafer substrate 130 is provided. The second wafer substrate 130 may be (or include) elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable material(s). In some embodiments, the second wafer substrate 130 includes multi-layer semiconductors, semiconductor-on-insulator (SOI) (e.g., silicon on insulator or germanium on insulator), and/or the like.

A circuitry structure 140 is formed on the second wafer substrate 130. The circuitry structure 140 includes a semiconductor component layer 142, a contact structure layer 144 and a first interconnect structure layer 146 sequentially formed on the second wafer substrate 130. The semiconductor component layer 142 may be formed using front-end of line (FEOL) fabrication techniques. In some embodiments, the FEOL includes at least several processes selected from an isolation process, a channel formation process, a gate oxidation/gate formation process, a doping process, a spacer formation process, and a source/drain formation process. The contact structure layer 144 may be formed using middle-end of line (MEOL) fabrication techniques. The MEOL includes contact metal formation process. The first interconnect structure layer 146 may be formed at a first side 142A of the semiconductor component layer 142 using back-end of line (BEOL) fabrication techniques. The BEOL includes the formation and the patterning of dielectric layers and conductive metal layers. In some embodiment, the BEOL and the MEOL may be combined.

The semiconductor component layer 142 includes semiconductor components such as one or more active component (e.g., a transistor or the like) and one or more passive component (e.g., a resistor, a capacitor, an inductor, or the like) or a combination thereof. The first interconnect structure layer 146 includes a plurality of interconnect layers embedded in a dielectric layer structure. The dielectric layer structure may include one or more of an oxide, an ultra-low-k dielectric material, a low-k dielectric material, and/or the like, and the interconnect layers may include conductive material(s) such as copper, aluminum, tungsten, a combination thereof, and/or the like. The interconnect layers may include a plurality of metal patterns (e.g., pads and lines) and metal vias alternatingly stacked in the dielectric layer structure. The contact structure layer 144 includes contact structures that connect the semiconductor components from in the semiconductor component layer 142 to the first interconnect structure layer 146.

The first interconnect structure layer 146 connects the active components and/or passive components formed in the semiconductor component layer 142 in a determined relationship to construct a required circuitry that performs determined function. In some embodiment, the circuitry formed by the circuitry structure 140 can be a logic circuit, a memory circuit, a sensor circuit, or the like. In the embodiment, a component region 102 and a periphery region 104 may be defined according to the arrangement of the semiconductor components formed in the semiconductor component layer 142 and the wiring layout of the interconnect structure layer 146. Specifically, the component region 102 is defined as the region where semiconductor components formed in the semiconductor component layer 142 are. The periphery region 104 is the region surrounding the component region 102 and extending between two component regions 102.

A second bonding layer 150 is formed on the first interconnect structure layer 146 through a deposition process. The deposition process of forming the second bonding layer 150 includes similar process for forming the first bonding layer 120 described in above. The material of the second bonding layer 150 can be an inorganic material. In some embodiments, the material of the second bonding layer 150 includes dielectric material selected from at least one of silicon oxide, silicon oxynitride, silicon nitride, undoped silicate glass (USG), borosilicate glass (BSG), phosphoric silicate glass (PSG), borophosphosilicate glass (BPSG), fluorinated silicate glass (FSG), tetraethoxysilane (TEOS) silicate oxide or a combination thereof.

As shown in FIG. 5, the second wafer substrate 130 is bonded to the first wafer substrate 110 by contacting the first bonding layer 120 to the second bonding layer 150 so that a bonded wafer structure BW1 is formed. The bonding process includes directly contacting the surface T120 of the first bonding layer 120 and the surface T150 of the second bonding layer 150 and thermal-compressing the first wafer substrate 110 to the second wafer substrate 130. The bonding process includes a fusion bonding, a room temperature wafer bonding or the like. The fusion bonding may include a hydrophilic fusion bonding, where a workable temperature may be approximately greater than or substantially equal to about 100° C. and a workable pressure may be approximately greater than or substantially equal to about 1 kg/cm². However, the disclosure is not specifically limited thereto. In some embodiments, the fusion bonding can be a dielectric-to-dielectric bonding (e.g., oxide-to-oxide bonding, nitride-to-nitride bonding, or nitride-to-oxide bonding).

The first bonding layer 120 can be permanently bonded to the second bonding layer 150 to form the bonded structure 160. A bonding interface BS is formed in the bonded structure 160 and includes a dielectric-to-dielectric bonding interface (e.g., an oxide-to-nitride bonding interface). In some embodiments, the materials of the first bonding layer 120 and the second bonding layer 150 can be similar or the same so that the bonding interface BS may be vague or even invisible in a real structure.

As shown in FIG. 5, the strength adjustment pattern 122 is an opened pattern prior to bonding the first wafer substrate 110 to the second wafer substrate 130 and is closed after bonding the first wafer substrate 110 to the second wafer substrate 130. Specifically, the strength adjustment pattern 122 formed in the first bonding layer 120 is enclosed by the second bonding layer 150 through the bonding process. The strength adjustment pattern 122 constructs an enclosed pattern in the bonded structure 160 of the bonded wafer structure BW1. In the bonded structure 160, the strength adjustment pattern 122 is leveled at the portion formed from the first bonding layer 120 and located within the periphery region 104. In some embodiments, the strength adjustment pattern 122 and the semiconductor components formed in the semiconductor component layer 142 are located at different regions without overlapping each other in the thickness direction.

The second bonding layer 150 includes a first portion 152 in direct contact with the first bonding layer 120 and a second portion 154 not in contact with the first bonding layer 120 during the bonding process. The second portion 154 closes the opened end of the strength adjustment pattern 122 and is spaced from the first wafer substrate 110 by an air gap AG. The air gap AG is defined by the strength adjustment pattern 122. In some embodiments, an extending depth of the air gap AG in the thickness direction can be less than the thickness of the first bonding layer 120.

In the embodiment, the second portion 154 of the second bonding layer 150 is not in contact with the first bonding layer 120 and thus the bonding interface BS of the second bonding layer 150 and the first bonding layer 120 is less than an overall area of the second bonding layer 150. For example, a difference between the overall area of the bonding interface BS and the overall area of the second bonding layer 150 can be the overall area of the second portion 154 of the second bonding layer 150. The overall area of bonding interface BS determines the bonding strength between the first wafer substrate 110 and the second wafer substrate 130 and the overall area of the strength adjustment pattern 122 determines the overall area of the bonding interface BS. For example, the smaller the overall area of the strength adjustment pattern 122 the larger the bonding interface BS, and the larger the bonding interface BS the larger the bonding strength. Therefore, the distribution density and the overall area of the strength adjustment pattern 122 can be used for adjusting the bonding strength.

In some embodiments, compared to a bonded wafer structure without a strength adjustment pattern 122, the bonding strength between the first wafer substrate 110 and the second wafer substrate 130 reduces to 83% when the overall area of the strength adjustment pattern 122 occupies 0.01% of the overall area of the second bonding layer 150, and reduces to 71% when the overall area of the strength adjustment pattern 122 occupies 0.24% of the overall area of the second bonding layer 150. Stronger bonding strength helps to ensure the bonding firmness of the bonded wafer structure BW1. However, stronger bonding strength causes extra stress that influences on the fabrication precision of the subsequent processes and causes unwanted voids or the like in the bonded structure 160. Therefore, the overall area of the strength adjustment pattern 122 can be determined based on different product designs.

Figure 6:
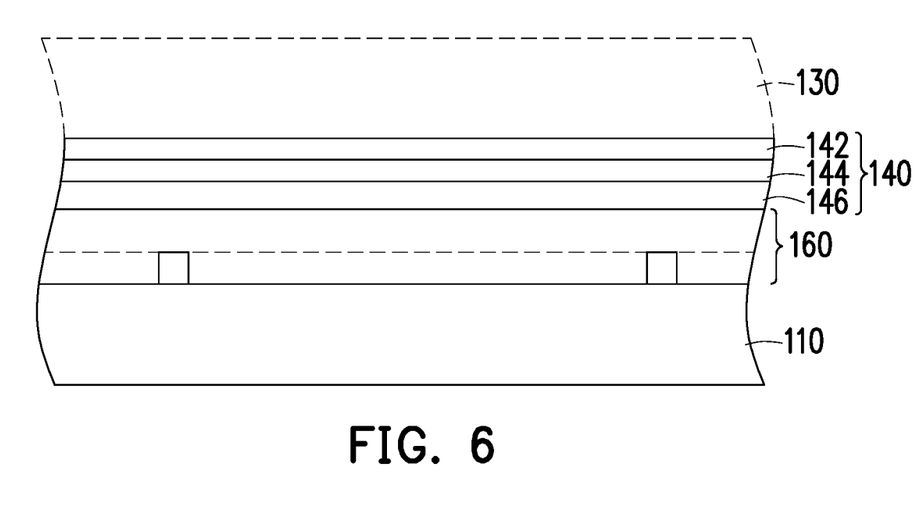

In FIG. 6, after bonding the first wafer substrate 110 to the second wafer substrate 130, the bonded wafer structure BW1 is oriented upside downed and a substrate removing process is performed to remove the second wafer substrate 130 from the circuitry structure 140. The substrate removing process includes a thinning process (e.g., CMP, grinding, etching, a combination thereof, and/or another applicable process). In the embodiment, the substrate removing process is performed without damaging any components formed in the circuitry structure 140.

Figure 7:
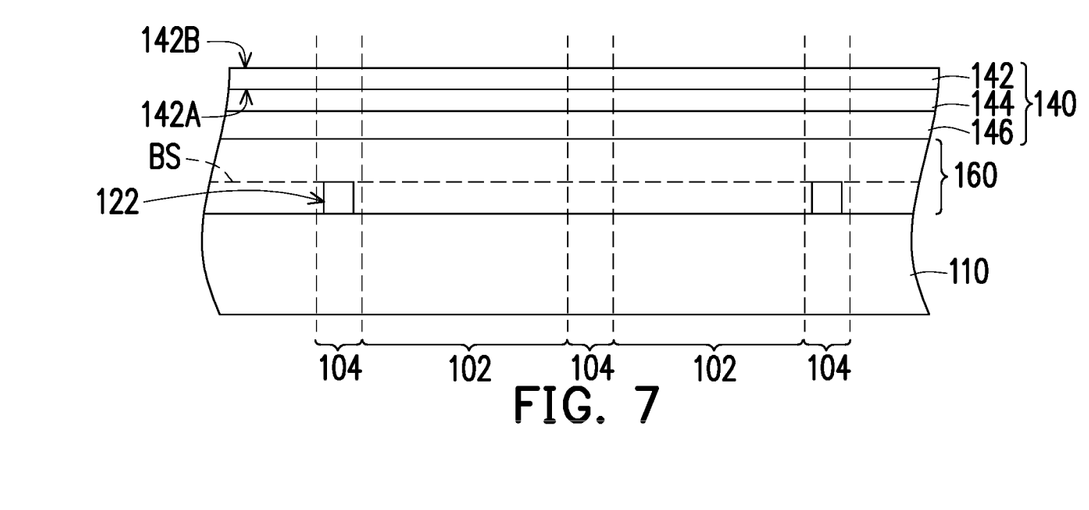

In FIG. 7, after removing the second wafer substrate 130, the bonded structure 160 and the circuitry structure 140 are sequentially disposed on the first wafer substrate 110 in the thickness direction and the circuitry structure 140 is uncovered. In the circuitry structure 140, the semiconductor component layer 142 is further away from the first wafer substrate 110 than the contact structure layer 144 and the contact structure layer 144 is further away from the first wafer substrate 110 than the first interconnect structure layer 146. In addition, certain conductor features (not shown) formed in the semiconductor component layer 142 is exposed at a second side 142B of the semiconductor component layer 142.

Figure 8:
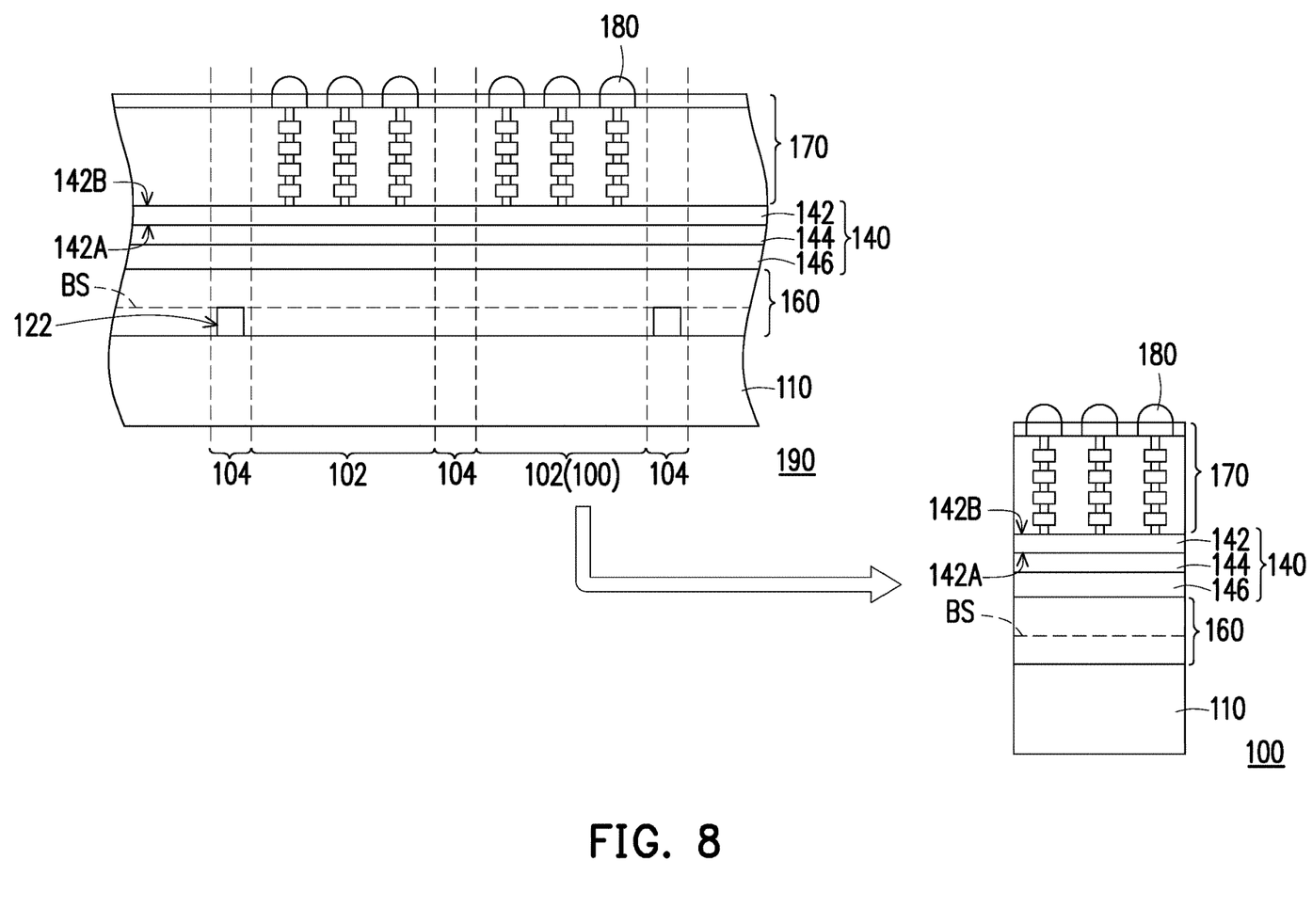

In FIG. 8, a second interconnect structure layer 170 is formed on the second side 142B of the semiconductor component layer 142 and a conductor terminal 180 is formed on the second interconnect structure layer 170 to obtain a semiconductor structure 190 at wafer level. The second interconnect structure layer 170 includes a plurality of interconnect layers embedded in a dielectric layer structure. The dielectric layer structure may include one or more of an oxide, an ultra-low-k dielectric material, a low-k dielectric material, and/or the like, and the interconnect layers may include conductive material(s) such as copper, aluminum, tungsten, a combination thereof, and/or the like. The interconnect layers may include a plurality of metal patterns (e.g., pads and lines) and metal vias alternatingly stacked in the dielectric layer structure. The conductor terminal 180 includes Sn ball electrically connected to an outermost conductor feature of the second interconnect structure layer 170.

After forming the conductor terminal 180, a singulation process is performed on the semiconductor structure 190 to obtain a semiconductor chip 100. The singulation process includes a die sawing process. For example, the semiconductor structure 190 is sawed along the periphery region 104 so that the portion in the component region 102 is individually cut from the semiconductor structure 190 to form one single semiconductor chip 100. Namely, the periphery region 104 is considered as the scribe line region in the singulation process. The semiconductor components formed in the semiconductor component layer 142 remain in the semiconductor chip 110 and are connected to form the required circuitry through the first interconnect structure layer 146 and the second interconnect structure layer 170 in the component region 102. In the sigulation process, the strength adjustment pattern 122 in the bonded structure 160 is separated from the semiconductor chip 100.

The semiconductor chip 100 includes the first wafer substrate 110, the bonded structure 160, the first interconnect structure layer 146, the contact structure layer 144, the semiconductor component layer 142, the second interconnect structure layer 170 and the conductor terminal 180. The bonded structure 160 has a bonding interface BS that is formed by bonding the first bonding layer and the second bonding layer described above. In some embodiments, the bonding interface BS in the semiconductor chip 100 extends throughout the bonded structure 160 in the lateral direction without a discontinuation. The first interconnect structure layer 146 and the second interconnect structure layer 170 are disposed at two opposite sides (the first side 142A and the second side 142B) of the semiconductor component layer 142. The contact structure layer 144 is disposed between the semiconductor component layer 142 and the first interconnect structure layer 146.

In some embodiments, the second interconnect structure layer 170 is formed using the BEOL similar to the method of forming the first interconnect structure layer 146. Some conductive features may be formed passing through the semiconductor component layer 142 to electrically connect the first interconnect structure layer 146 and the second interconnect structure layer 170 at two opposite sides. In addition, the first interconnect structure layer 146 is electrically connected to the semiconductor components in the semiconductor component layer 142. Therefore, the second interconnect structure layer 170 is electrically connected to the semiconductor components in the semiconductor component layer 142 through the first interconnect structure layer 146. The conductor terminal 180 is electrically connected to the second interconnect structure layer 170 and used for bonding and electrically connecting to an external device so that the electric signal of the semiconductor components formed in the semiconductor component layer 142 can be transmitted to the external device.

Figure 9:
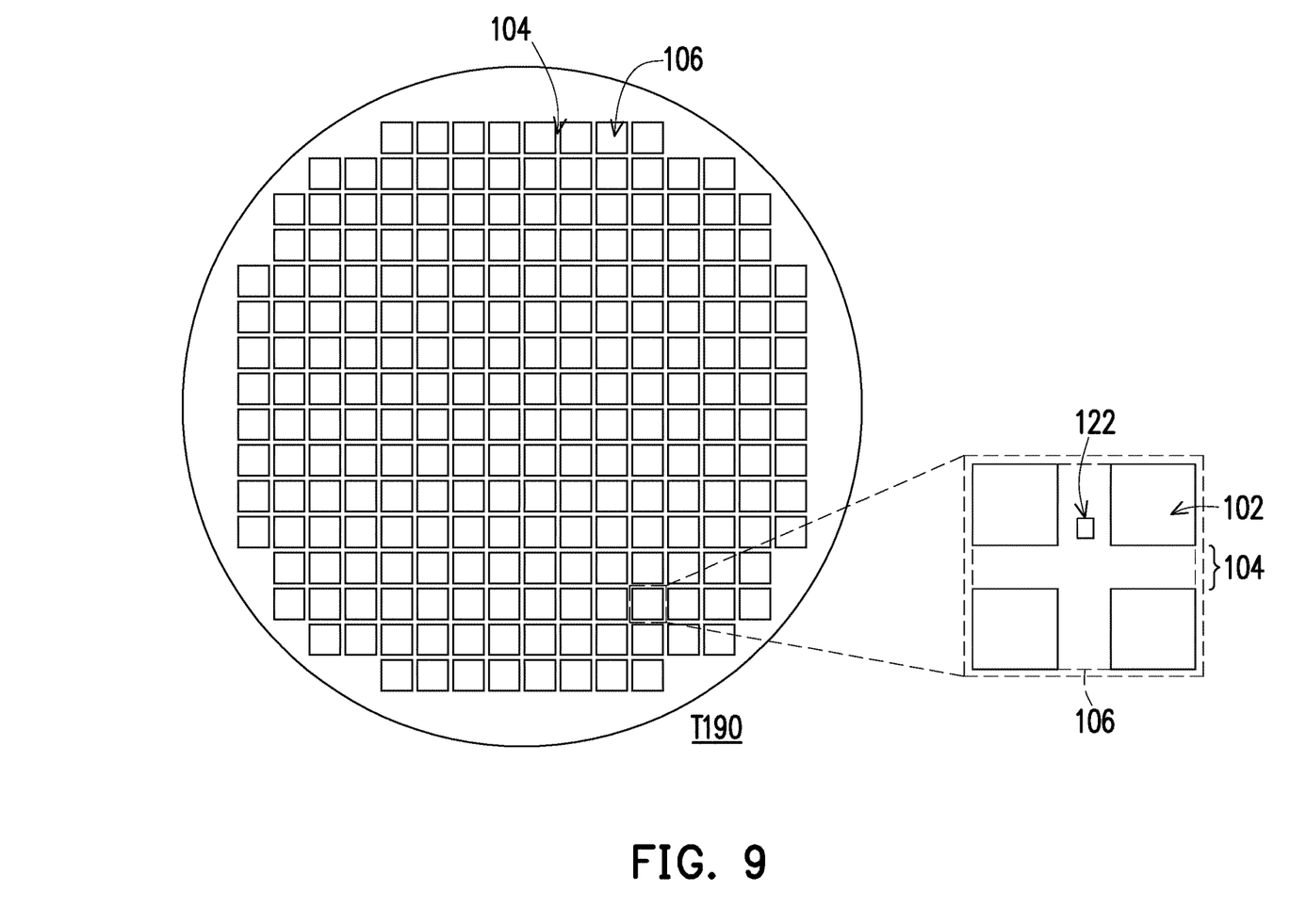
FIG. 9 schematically illustrates a top view and a partial enlarged top view of a semiconductor structure in accordance with some embodiments of the disclosure.

FIG. 9 schematically illustrates a top view and a partial enlarged top view of a semiconductor structure in accordance with some embodiments of the disclosure. The top view shown in FIG. 9 presents the distribution of various regions and is considered as an implemental example for the semiconductor structure 190 of FIG. 8. Therefore, the detail structures and components of the semiconductor structure 190 are referred to the description of FIG. 8 without showing in FIG. 9. In FIG. 9, the semiconductor structure 190 may include a plurality of unit regions 106 that are separated from each other by the periphery region 104. The periphery region 134 is arranged along net-like trace. One unit region 106 includes a plurality of component regions 134 separated by the periphery region 132 as shown in the enlarged view, but the disclosure is not limited thereto. The singulation process described in FIG. 8 may include a first sawing process that cuts along the periphery region 104 between the unit regions 106 to separate the unit regions 106 and a second subsequent sawing process that cuts along the periphery region 104 in the unit region 106 to separate the semiconductor chips from the unit region 106.

Referring to FIG. 8 and FIG. 9 together, the strength adjustment pattern 122 is positioned within the periphery region 104 and the semiconductor components formed in the semiconductor component later 142 are positioned within the component region 102. In some embodiments, the strength adjustment pattern 122 is positioned within the periphery region 104 between the unit regions 106. In some embodiments, as shown in FIG. 9, the strength adjustment pattern 122 is positioned within the periphery region 104 arranged in the unit region 106 and between the component regions 132. The semiconductor chip 100 cut and singulated from the semiconductor structure 190 does not include the strength adjustment pattern 122 since the strength adjustment pattern 122 is located in the periphery region 104, e.g. the scribe line region. In some embodiments, certain alignment marks, test circuitry structures, dummy components, or a combination thereof may also be disposed in the periphery region 104 and not included in the sigulated semiconductor chip 100.

Figure 10:
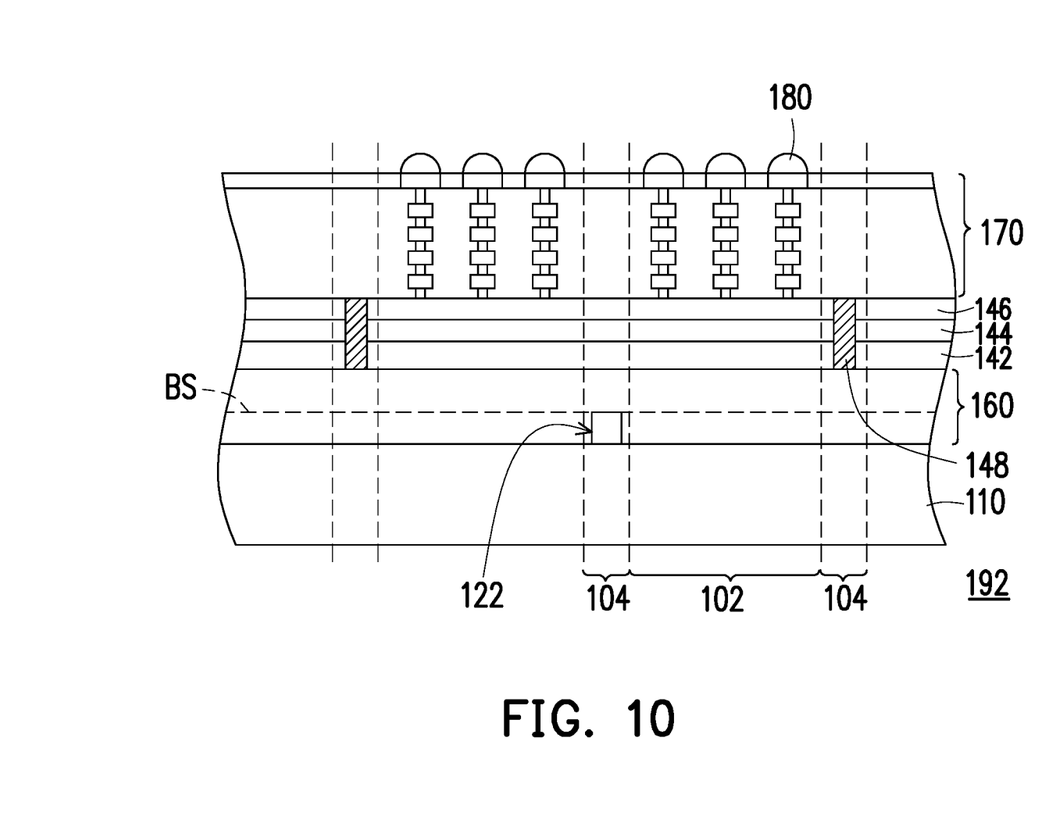
FIG. 10 schematically illustrates a cross section view of a semiconductor structure in accordance with some embodiments of the disclosure.

FIG. 10 schematically illustrates a cross section view of a semiconductor structure in accordance with some embodiments of the disclosure. A semiconductor structure 192 of FIG. 10 is similar to the semiconductor structure 190 of FIG. 8 and can be fabricated by using the steps described in FIGS. 1 to 8. Therefore, the same reference numbers in the two drawings represent the same components. The semiconductor structure 192 includes a first wafer substrate 110, a bonded structure 160, a first interconnect structure layer 146, a contact structure layer 144, a semiconductor component layer 142, an alignment mark 148, a second interconnect structure layer 170 and a conductor terminal 180. Specifically, the semiconductor structure 192 includes all the components described in FIG. 8 and further includes the alignment mark 148.

In the embodiment, the alignment mark 148 is an overlay alignment mark that is formed in the fabrication processes of forming the features and components in the first interconnect structure layer 146, the contact structure layer 144 and the semiconductor component layer 142. The alignment mark 148 may be used as the alignment reference when fabricating various components/features using various layers. The alignment mark 148 is positioned within the periphery region 104, similar to the strength adjustment pattern 122. In the embodiment, the strength adjustment pattern 122 may not overlap the alignment mark 148, but not limited thereto. In some embodiments, the alignment mark 148 and the strength adjustment pattern 122 may overlap with each other so that the strength adjustment pattern 122 is also used as a reference for alignment.

Figure 11:
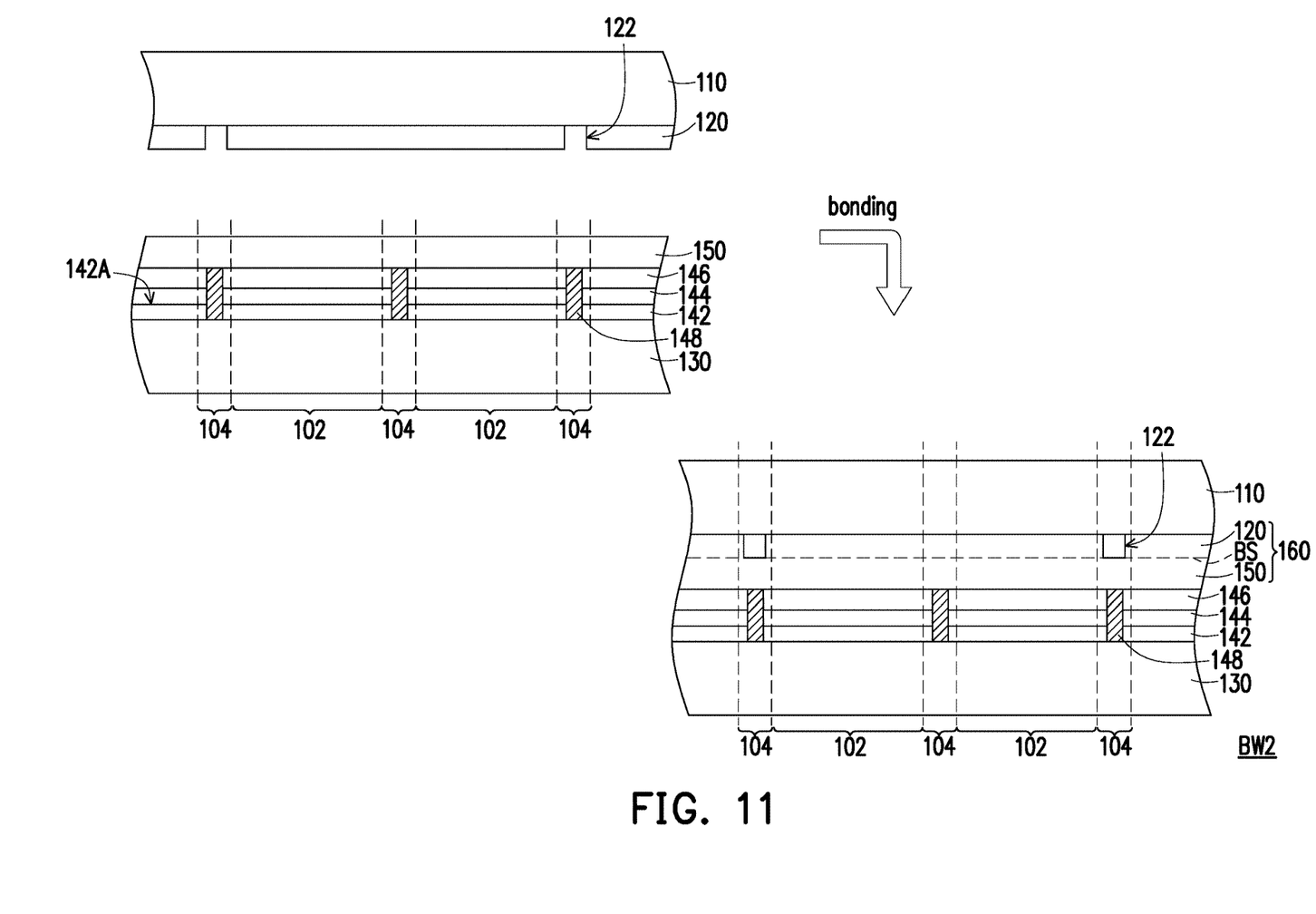
FIG. 11 schematically illustrates alternative steps of FIG. 5 in accordance with some embodiments of the disclosure.

FIG. 11 schematically illustrates alternative steps of FIG. 5 in accordance with some embodiments of the disclosure. The components presented in FIG. 5 are all included in FIG. 11 and the structure of FIG. 11 further includes an alignment mark 148. In the embodiment, the structure of a first bonding layer 120 forming on a first wafer substrate 110 is provided and a strength adjustment pattern 122 is formed in the first bonding layer 120, for example, using the steps described in FIGS. 1 to 4. In addition, a second wafer substrate 130 is also provided. Specifically, on the second wafer substrate 130 in FIG. 11, a semiconductor component layer 142, a contact structure layer 144, a first interconnect structure layer 146, the alignment mark 148 and a second bonding layer 150 are formed.

Similar to the step of FIG. 5, the semiconductor component layer 142 is form using the FEOL, the contact structure layer 144 is formed using the MEOL and the first interconnect structure layer 146 is formed using the BEOL. In addition, the alignment mark 148 is an overlay alignment mark that is formed in the fabrication processes of forming the features/components in the first interconnect structure layer 146, the contact structure layer 144 and the semiconductor component layer 142. In the embodiment, a component region 102 is defined by the semiconductor components formed in the semiconductor component layer 142 and a periphery region 104 is defined as the region surrounding the component region 102. The arrangement of the component region 102 and the periphery region 104 from the top view may refer to FIG. 9. In the embodiment, the alignment mark 148 is located within the periphery region 104.

The second wafer substrate 130 is bonded to the first wafer substrate 110 by contacting the first bonding layer 120 to the second bonding layer 150 so that a bonded wafer structure BW2 is formed. The first bonding layer 120 can be permanently bonded to the second bonding layer 150 to form a bonded structure 160 having the strength adjustment pattern 122 and a bonding interface BS. In the bonding step, the strength adjustment pattern 122 is positioned within the periphery region 104 and over the alignment mark 148.

Figure 12:
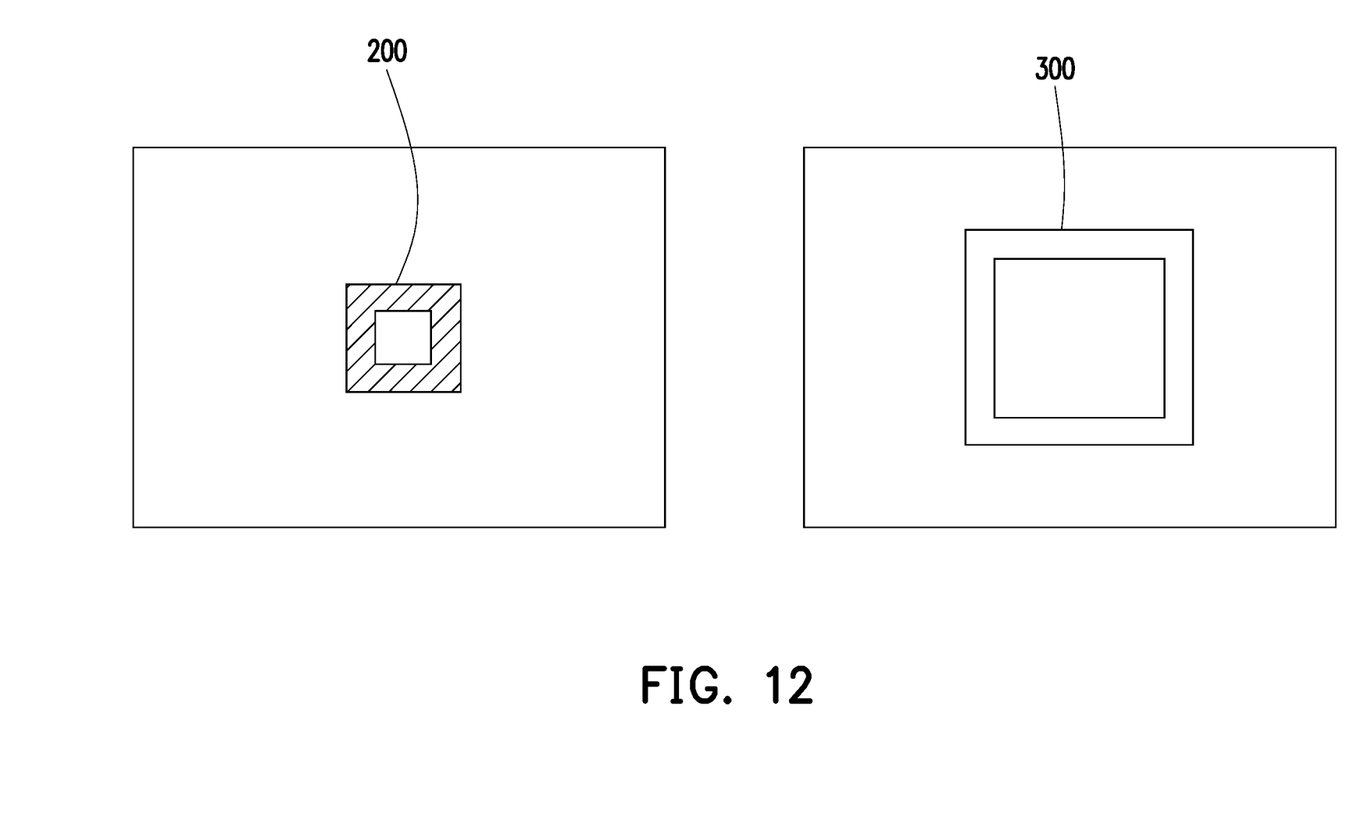
FIG. 12 schematically illustrates top view patterns of the strength adjustment pattern and the alignment mark in some embodiments of the disclosure.

FIG. 12 schematically illustrates top view patterns of the strength adjustment pattern and the alignment mark in some embodiments of the disclosure. In FIG. 12, a top view pattern 200 has a rectangular ring-like shape, a top view pattern 300 also has a rectangular ring-like shape, and the size of the top view pattern 200 is different from the size of the top view pattern 300. In some embodiments, the shapes of the top view pattern 200 and the top view pattern 300 are different. For illustration purpose, one of the top view pattern 200 and the top view pattern 300 is served as an implemental example of the strength adjustment pattern 122 and the other is served as an implemental example of the alignment mark 148.

Figure 13:
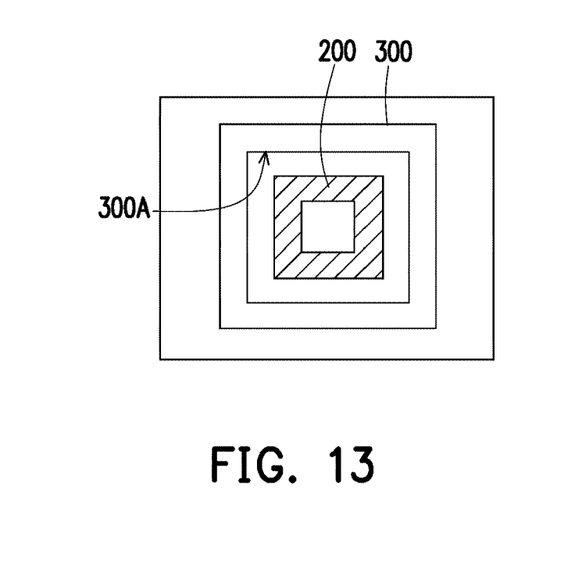
FIG. 13 schematically illustrate the relationship of the top view patterns in the bonded wafer structure BW2 of FIG. 11.

FIG. 13 schematically illustrate the relationship of the top view patterns in the bonded wafer structure BW2 of FIG. 11. Referring to FIG. 11, the strength adjustment pattern 122 and the alignment mark 148 stack in the thickness direction of the bonded wafer structure BW2 after the bonding process, and from top view, and the relationship between the strength adjustment pattern 122 and the alignment mark 148 may be positioned in a specific relationship as shown in FIG. 13, for example. In FIG. 13, the top view pattern 200 is completely located within the opening region 300A of the top view pattern 300. At least a portion of the outline of the top view pattern 200 conforms to a portion of the outline of the top view pattern.

In some embodiments, the relationship between top view pattern 200 and the top view pattern 300 serves as a reference indicating the status of the second wafer substrate 130. For example, in some embodiments, the outline of the top view pattern 200 substantially completely conforms/corresponds to the outline of the top view pattern 300, which represents the strength adjustment pattern 122 is well aligned with the alignment mark 148 in the bonded wafer structure BW2. Good alignment between the strength adjustment pattern 122 and the alignment mark 148 may indicate that the second wafer substrate 130 presents in a desirable status. For example, no significant or unwanted deformation of the second wafer substrate 130 occurs during forming components/features on the second wafer substrate 130. As a result, a desirable yield rate may be expected upon the determination of good alignment between the strength adjustment pattern 122 and the alignment mark 148.

In some alternative embodiments, the outline of the top view pattern 200 may keep a shifted relationship from the outline of the top view pattern 300 in the bonded wafer structure, which means a misalignment between the strength adjustment pattern 122 and the alignment mark 148. In some embodiments, the misalignment between the strength adjustment pattern 122 and the alignment mark 148 may be caused by various reasons and indicate that the status of the second wafer substrate 130 and/or a portion of the processes forming the components/features on the second wafer substrate 130 is not desirable. Therefore, certain adjustment on the subsequent process after the bonging process may be considered according to the misalignment. For example, the photolithography process performed after the bonding process of FIG. 11 may be rearranged for forming the predetermined features. In some embodiments, if the misalignment is determined too serious to be fixed by adjusting the subsequent processes, the bonded wafer structure BW2 may be considered failure and the factory may stop the fabrication without proceeding the subsequent processes on the failed bonded wafer structure BW2.

Figure 14:
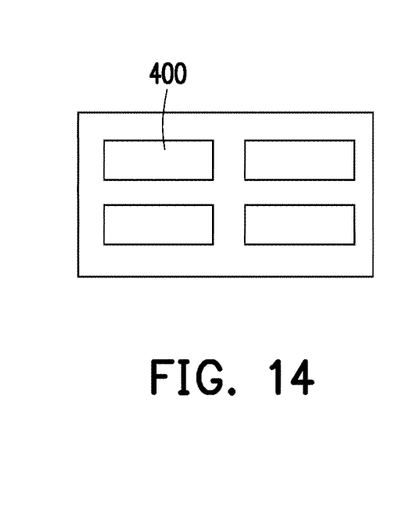
FIGS. 14 and 15 schematically illustrate various examples of the top view patterns of the alignment mark and the strength adjustment pattern in accordance with some embodiments of the disclosure.
Figure 15:
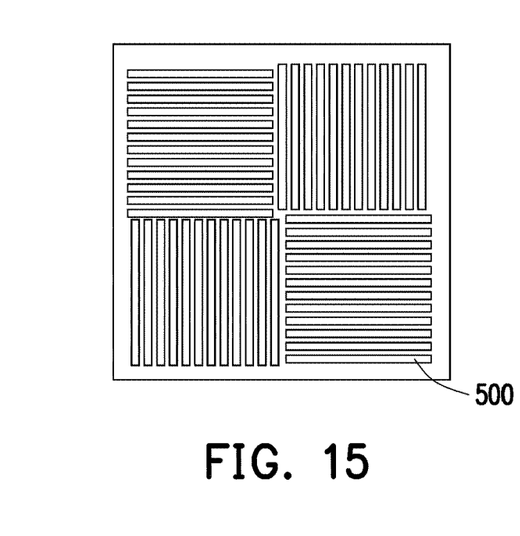

FIGS. 14 and 15 schematically illustrate various examples of the top view patterns of the alignment mark and the strength adjustment pattern in accordance with some embodiments of the disclosure. The top view patterns 400 in FIG. 14 are rectangular patterns and the top view patterns 500 FIG. 15 are stripe patterns that extend along two direction. In some embodiments, the top view pattern of the alignment mark can be any pattern that has a geometric feature corresponding to, complementary to, or having a specific relationship with respect to the top view pattern of the strength adjustment pattern.

The semiconductor chip fabricated by using the method described above may be or may be applicable to an Integrated-Fan-Out package, a Chip-On-Wafer substrate-On-Substrate package, a Chip-On-Wafer substrate package, etc. In addition, other packaging techniques may be used to package the semiconductor chip fabricated by using the method described. The semiconductor package having the semiconductor chip fabricated by using the method described may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In the method of fabricating a semiconductor chip according to embodiments of the disclosure, the bonding layer bonding two wafer substrates has a strength adjustment pattern so that the bonding strength of two wafer substrates is adjustable based on various fabrications. Therefore, the peeling of the wafer substrate due to the poor bonding strength and the poor alignment of the fabricating features due to the extra bonding strength are prevented. For example, in the case the unwanted bonding result occurs, the fabrication process is adjustable by changing the amount/size of the strength adjustment pattern in the bonding layer without changing the bonding material or changing the bonding machine, which save the fabrication time and cost. The disclosure provides an efficient method of fabricating a semiconductor chip.

In accordance with some embodiments, a method of fabricating a semiconductor chip includes the following steps. A bonding material layer is formed on a first wafer substrate. The bonding material layer is patterned to form a first bonding layer having a strength adjustment pattern. A semiconductor component layer and a first interconnect structure layer are formed on a second wafer substrate, the first interconnect structure layer being located at a first side of the semiconductor component layer. A second bonding layer is formed on the first interconnect structure layer. The second wafer substrate is bonded to the first wafer substrate by contacting the second bonding layer with the first bonding layer, wherein a bonding interface of the second bonding layer and the first bonding layer is smaller than an area of the second bonding layer. A second interconnect structure layer is formed on the semiconductor component layer at a second side of semiconductor component layer, wherein the second interconnect structure layer is electrically connected to the first interconnect structure layer. A conductor terminal is formed on the second interconnect structure layer. The bonding material layer may be patterned through a photolithography and etching process or a laser irradiation process. The second wafer substrate may be further removed from the semiconductor component layer prior to forming the second interconnect structure layer. The strength adjustment pattern may be a concave formed in the first bonding layer. The strength adjustment pattern may extend through a thickness of the first bonding layer. The second wafer substrate may have a component region and a periphery region surrounding the component region, and the strength adjustment pattern may be located within the periphery region. Materials of the second bonding layer and the first bonding layer may include silicon oxide, silicon oxynitride, silicon nitride, undoped silicate glass (USG), borosilicate glass (BSG), phosphoric silicate glass (PSG), borophosphosilicate glass (BPSG), fluorinated silicate glass (FSG), tetraethoxysilane (TEOS) silicate oxide, or a combination thereof. The first wafer substrate may be a raw substrate. The strength adjustment pattern may be closed by the second bonding layer after bonding the second wafer substrate to the first wafer substrate.

In accordance with some embodiments, a method of fabricating a semiconductor chip includes the following steps: forming a first bonding layer on a first wafer substrate, wherein the first bonding layer has a strength adjustment pattern; forming a semiconductor component layer, a first interconnect structure layer and an alignment mark on a second wafer substrate, the semiconductor component layer being disposed between the second wafer substrate and the first interconnect structure layer; forming a second bonding layer on the first interconnect structure layer; bonding the second wafer substrate to the first wafer substrate by contacting the second bonding layer with the first bonding layer and positioning the strength adjustment pattern over the alignment mark; forming a second interconnect structure layer on the semiconductor component layer, wherein the second interconnect structure layer and the first interconnect structure layer are electrically connected to each other and located at opposite sides of the semiconductor component layer; and forming a conductor terminal on the second interconnect structure layer. The first bonding layer may be formed on the first wafer substrate through a deposition process followed by a patterning process. An outline of the strength adjustment pattern at least partially may conform to an outline of the alignment mark from a top view. Materials of the second bonding layer and the first bonding layer may include silicon oxide, silicon oxynitride, silicon nitride, undoped silicate glass (USG), borosilicate glass (BSG), phosphoric silicate glass (PSG), borophosphosilicate glass (BPSG), fluorinated silicate glass (FSG), tetraethoxysilane (TEOS) silicate oxide, or a combination thereof. The second wafer substrate may be further removed from the semiconductor component layer prior to forming the second interconnect structure layer. The strength adjustment pattern may be closed by the second bonding layer after bonding the second wafer substrate to the first wafer substrate. The first wafer substrate may be a raw substrate. The strength adjustment pattern may be formed in the first bonding layer through a laser irradiation or a photolithography and etching process.

In accordance with some embodiments, a method of fabricating a semiconductor chip includes the following steps: forming a first bonding layer on a first wafer substrate; sequentially forming a semiconductor component layer and a first interconnect structure layer on a second wafer substrate; forming a second bonding layer on the first interconnect structure layer; bonding the second wafer substrate to the first wafer substrate by contacting a first portion of the second bonding layer with the first bonding layer and keeping a second portion of the second bonding layer from the first wafer substrate by an air gap; forming a second interconnect structure layer on the semiconductor component layer at a second side of semiconductor component layer, wherein the second interconnect structure layer is electrically connected to the first interconnect structure layer; and forming a conductor terminal on the second interconnect structure layer. The air gap may pass through the first bonding layer. The second wafer substrate may be removed from the semiconductor component layer prior to forming the second interconnect structure layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor chip, comprising:
    form a first bonding layer on a first wafer substrate, the first bonding layer having a recess;
    forming a circuitry structure and a second bonding layer on a second wafer substrate, the circuitry structure being located between the second wafer substrate and the second bonding layer;
    bonding the second wafer substrate to the first wafer substrate by contacting the second bonding layer with the first bonding layer;
    removing the second wafer substrate;
    forming a conductor terminal on the circuitry structure, wherein the conductor terminal is positioned in a component region keeping from the recess of the first bonding layer; and
    performing a singulation process to obtain a semiconductor chip comprising the circuitry structure and the conductor terminal, wherein the recess is separated from the semiconductor chip by the singulation process.

2. The method of claim 1, wherein the first bonding layer is patterned through a photolithography and etching process or a laser irradiation process to form the recess.

3. The method of claim 1, wherein the recess stops at a level that the first bonding layer is in contact with the second bonding layer.

4. The method of claim 1, wherein the recess extends along a thickness of the first bonding layer.

5. The method of claim 1, wherein the recess is located within a periphery region and the circuitry structure comprises a circuit component located outside the periphery region.

6. The method of claim 1, wherein materials of the second bonding layer and the first bonding layer comprise silicon oxide, silicon oxynitride, silicon nitride, undoped silicate glass (USG), borosilicate glass (BSG), phosphoric silicate glass (PSG), borophosphosilicate glass (BPSG), fluorinated silicate glass (FSG), tetraethoxysilane (TEOS) silicate oxide, or a combination thereof.

7. The method of claim 1, wherein the first wafer substrate is a raw substrate.

8. The method of claim 1, wherein the circuitry structure comprises a semiconductor component layer, a first interconnect structure layer located at a first side of the semiconductor component layer, and a second interconnect structure layer located at a second side of the semiconductor component layer.

9. The method of claim 8, wherein the second wafer substrate is removed from the semiconductor component layer prior to forming the second interconnect structure layer at the second side of the semiconductor component layer.

10. A method of fabricating a semiconductor chip, comprising:
forming a first bonding layer on a first wafer substrate, wherein the first bonding layer has a recess;
forming a semiconductor component layer, a first interconnect structure layer and an alignment mark on a second wafer substrate, wherein the semiconductor component layer comprises a circuit component and the alignment mark keeps from the circuit component in a lateral direction;
forming a second bonding layer on the first interconnect structure layer;
bonding the second wafer substrate to the first wafer substrate by contacting the second bonding layer with the first bonding layer and aligning the recess with the alignment mark, wherein a first portion of the second bonding layer overlapping the recess and a second portion of the second bonding layer in contact with the first bonding layer has a same thickness;
removing the second wafer substrate;
forming a second interconnect structure layer on the semiconductor component layer, wherein the second interconnect structure layer and the first interconnect structure layer are located at opposite sides of the semiconductor component layer;
forming a conductor terminal on the second interconnect structure layer; and
performing a singulation process to obtain a semiconductor chip comprising the semiconductor component layer, the first interconnect structure layer, the second interconnect structure layer and the conductor terminal, wherein the recess is separated from the semiconductor chip by the singulation process.

11. The method of claim 10, wherein the first bonding layer is formed on the first wafer substrate through a deposition process followed by a patterning process to have the recess.

12. The method of claim 10, wherein an outline of the recess at least partially conforms to an outline of the alignment mark from a top view.

13. The method of claim 10, wherein materials of the second bonding layer and the first bonding layer comprise silicon oxide, silicon oxynitride, silicon nitride, undoped silicate glass (USG), borosilicate glass (BSG), phosphoric silicate glass (PSG), borophosphosilicate glass (BPSG), fluorinated silicate glass (FSG), tetraethoxysilane (TEOS) silicate oxide, or a combination thereof.

14. The method of claim 10, wherein the second wafer substrate is removed from the semiconductor component layer prior to forming the second interconnect structure layer.

15. The method of claim 10, wherein the recess is closed to form a closed volume embedded in a bonded structure of the first bonding layer and the second bonding layer.

16. The method of claim 10, wherein the first wafer substrate is a raw substrate.

17. The method of claim 10, wherein the recess is formed in the first bonding layer through a laser irradiation or a photolithography and etching process.

18. A method of fabricating a semiconductor chip, comprising:
forming a first bonding layer on a first wafer substrate;
sequentially forming a semiconductor component layer, a first interconnect structure layer, and a second bonding layer on a second wafer substrate;
bonding the second wafer substrate to the first wafer substrate by contacting the second bonding layer with the first bonding layer, wherein an air gap is formed extending along a thickness of the first bonding layer and stopping at a level that the first bonding layer is in contact with the second bonding layer;
removing the second wafer substrate;
forming a second interconnect structure layer on the semiconductor component layer at a second side of semiconductor component layer, wherein the second interconnect structure layer is electrically connected to the first interconnect structure layer;
forming a conductor terminal on the second interconnect structure layer; and
performing a singulation process to obtain a semiconductor chip comprising the semiconductor component layer, the first interconnect structure layer, the second interconnect structure layer and the conductor terminal, wherein the air gap is separated from the semiconductor chip by the singulation process.

19. The method of claim 18, wherein the first wafer substrate is a raw substrate.

20. The method of claim 18, wherein the second wafer substrate is removed from the semiconductor component layer prior to forming the second interconnect structure layer.

* * * * *